(12) United States Patent
Li

(10) Patent No.: US 7,998,228 B2
(45) Date of Patent: Aug. 16, 2011

(54) TANTALUM CMP COMPOSITIONS AND METHODS

(75) Inventor: Shoutian Li, Naperville, IL (US)

(73) Assignee: Cabot Microelectronics Corporation, Auora, IL (US)

( * ) Notice: Subject to any disclaimer, the term of this patent is extended or adjusted under 35 U.S.C. 154(b) by 884 days.

(21) Appl. No.: 11/489,054

(22) Filed: Jul. 19, 2006

(65) Prior Publication Data

US 2008/0016784 A1  Jan. 24, 2008

(51) Int. Cl.
  *B24D 3/02*  (2006.01)
  *C09C 1/68*  (2006.01)
  *C09K 3/14*  (2006.01)
  *C09G 1/02*  (2006.01)
(52) U.S. Cl. ............................. 51/307; 51/309; 106/3
(58) Field of Classification Search ............ 51/307–309; 106/3
See application file for complete search history.

(56) References Cited

U.S. PATENT DOCUMENTS

| 5,527,423 | A | 6/1996 | Neville et al. | |
| 6,976,905 | B1* | 12/2005 | Fang et al. | 451/41 |
| 2001/0013506 | A1 | 8/2001 | Chamberlin et al. | |
| 2005/0005525 | A1* | 1/2005 | Li et al. | 51/298 |

OTHER PUBLICATIONS

Kuiry, et al., "Effect of pH and H2O2 on Ta Chemical Mechanical Planarization" Journal of the Electrochemical Society, vol. 150 (1), pp. C36-C43 (2003).
Li, et al., "Chemical Mechanical Polishing of Copper and Tantalum in Potassium Iodate-Based Slurries," Electrochemical and Solid-State Letters, vol. 4(2), pp. G20-G22 (2001).

\* cited by examiner

*Primary Examiner* — Anthony J Green
*Assistant Examiner* — Pegah Parvini
(74) *Attorney, Agent, or Firm* — Thomas F. Omholt; Robert J. Ross; Steven D. Weseman

(57) ABSTRACT

A composition suitable for tantalum chemical-mechanical polishing (CMP) comprises about 0.1 to about 10 percent by weight of a zirconia or fumed alumina abrasive, about 0.1 to about 10 percent by weight of an alkali metal iodate salt and an aqueous carrier. The composition has a pH of at least about 10. The composition is utilized to polish a surface of a tantalum-containing substrate.

20 Claims, 5 Drawing Sheets

TANTALUM CMP COMPOSITIONS AND METHODS

FIELD OF THE INVENTION

This invention relates to compositions and methods for polishing a surface of a tantalum-containing substrate. More particularly, this application relates to chemical-mechanical polishing compositions containing an oxidizing agent and an abrasive.

BACKGROUND OF THE INVENTION

Semiconductor wafers are typically composed of a substrate, on which a plurality of transistors has been formed. Integrated circuits are chemically and physically connected into a substrate by patterning regions in the substrate and layers on the substrate. Various metals, metal oxides, metal nitrides, metal alloys, and the like have been used to form electrical connections between interconnection levels and devices, including titanium, titanium nitride, aluminum-copper, aluminum-silicon, copper, tungsten, platinum, platinum-tungsten, platinum-tin, ruthenium, tantalum, tantalum nitride, and combinations thereof.

To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

Compositions and methods for planarizing or polishing the surface of substrates, such as semiconductors, are well known in the art. Polishing compositions (also known as polishing slurries) typically contain an abrasive material in an aqueous solution and are applied to a surface by contacting the surface with a polishing pad saturated with the slurry composition. Typical abrasive materials include silica (silicon dioxide), ceria (cerium oxide), alumina (aluminum oxide), zirconia (zirconium oxide), and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates, and their use in the chemical-mechanical polishing of semiconductor surfaces can result in poor surface quality. Because the performance of a semiconductor wafer is directly associated with the planarity of its surface, it is crucial to use a polishing composition and method that results in a high polishing efficiency, uniformity, and removal rate and leaves a high quality polish with minimal surface defects.

Chemical-mechanical polishing of tantalum-containing surfaces, such as tantalum removal in barrier film applications, typically utilize an oxidizing agent. Hydrogen peroxide is by far the most common oxidizing agent used in tantalum CMP. Hydrogen peroxide is a strong oxidizing agent that can react with other slurry components limiting pot-life stability of the polishing slurry composition. Electron transfer catalysts such as Fe, Os, or Ru cations can be added at low pH to act cooperatively with hydrogen peroxide to accelerate oxidation and removal of the metals present on the surface being polished. At elevated pH values, these metal electron transfer catalysts precipitate as oxide and hydroxide compounds, and lose their effectiveness as electron transfer catalysts. It is often also desirable to selectively oxidize tantalum in the presence of copper. Many common oxidizing agents are not selective between tantalum and copper.

There is an ongoing need for polishing composition and polishing methods that will exhibit desirable planarization efficiency and tantalum removal rate during the polishing and planarization of tantalum-containing substrates, and which do not rely on hydrogen peroxide for chemical removal of tantalum. The present invention provides such improved chemical-mechanical polishing compositions and methods. These and other advantages of the invention will be apparent from the description of the invention provided herein.

BRIEF SUMMARY OF THE INVENTION

The invention provides a composition suitable for tantalum CMP. A composition of the invention comprises about 0.1 to about 10 percent by weight of a zirconia or fumed alumina abrasive, about 0.1 to about 10 percent by weight of an alkali metal iodate salt and an aqueous carrier. The composition has a pH of at least about 10.

A method of polishing a tantalum-containing substrate comprises abrading a surface of a tantalum-containing substrate with a CMP composition of the invention. Preferably, the substrate comprises copper and/or silicon oxide, in addition to tantalum. Typically, the substrate is abraded by contacting the CMP composition with the surface of the substrate to be polished utilizing a polishing pad.

Advantageously, the CMP compositions of the invention have a commercially useful shelf life and are capable of selectively removing tantalum in the presence of copper and/ or a silicon oxide (e.g., TEOS). In addition, the CMP compositions of the invention exhibit an unexpectedly high efficiency for tantalum removal compared to CMP compositions containing hydrogen peroxide as an oxidant.

DETAILED DESCRIPTION OF THE INVENTION

Figure 1:
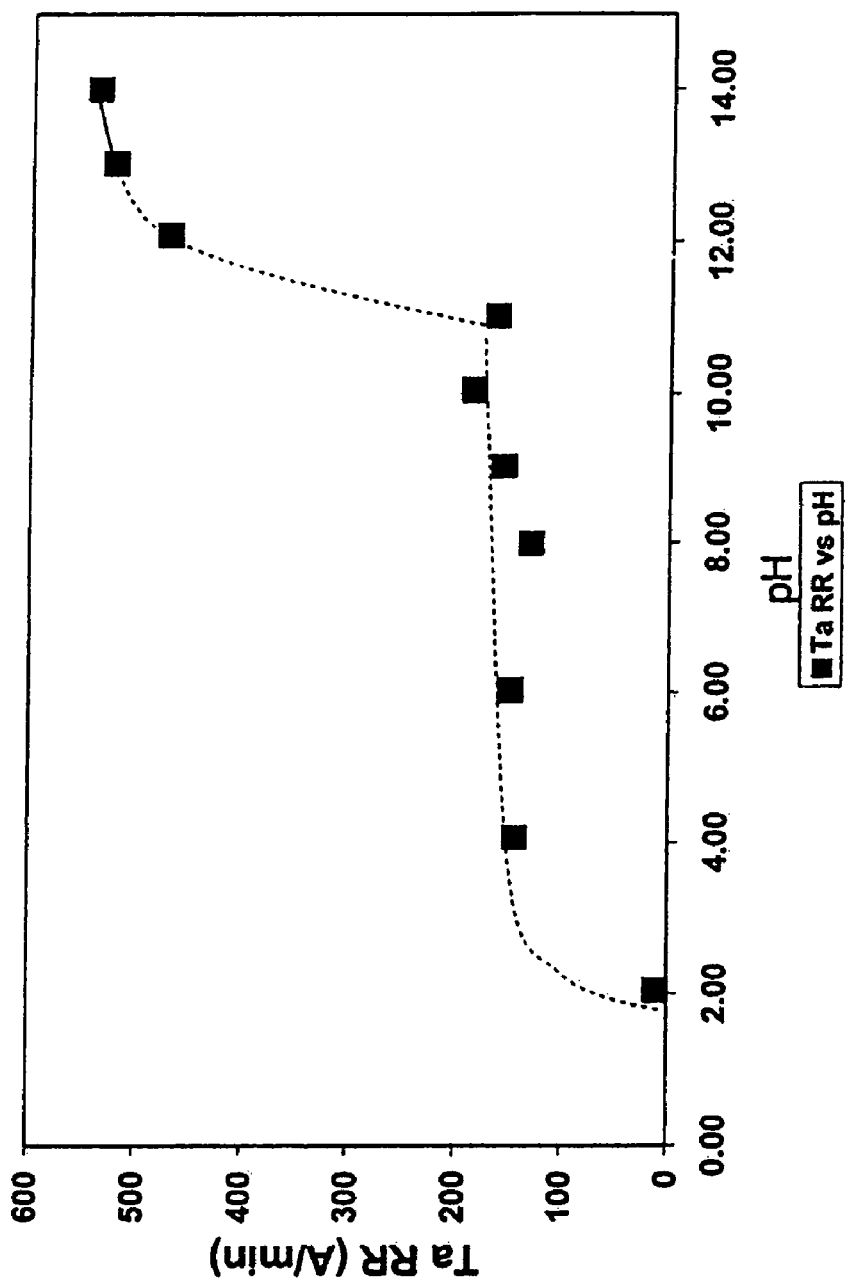
FIG. 1 illustrates the effect of pH on tantalum removal rates for CMP compositions containing fumed alumina and potassium iodate.

The present invention is directed to compositions and methods for polishing a substrate comprising tantalum. The compositions comprise a zirconia or fumed alumina abrasive and an alkali metal iodate salt in a liquid carrier.

The CMP compositions of the invention have a relatively long, and commercially useful pot/shelf life compared to hydrogen peroxide-based tantalum CMP compositions. For example, a CMP composition containing about 3 percent by weight of fumed alumina and about 1 percent by weight potassium iodate in deionized water was stored for a six week period at ambient room temperature. Periodically, the CMP composition was used to polish tantalum blanket wafers. The tantalum removal rates observed did not vary significantly over the six week period. The useful pot life for hydrogen peroxide-based tantalum CMP compositions is generally only a few days, without replenishment of the oxidant. In addition, the compositions of the invention are capable of selectively removing tantalum in the presence of copper and/or a silicon oxide (e.g., TEOS).

The CMP compositions of any of the above embodiments have a pH of at least about 10. Preferably the pH is at least about 11, more preferably at least about 12. The pH can be selected, at least in part, based on the composition of substrate being polished, the type of abrasive (i.e., zirconia or fumed alumina), and the degree of tantalum removal desired. For example, when the abrasive is fumed alumina, the pH preferably is at least about 12 when relatively high rates of tantalum removal are desired (i.e., greater than about 100 Å/min).

The compositions of the present invention comprise about 0.1 to about 10 percent by weight of a zirconia or fumed alumina abrasive. In some preferred embodiments, the amount of abrasive in the composition is in the range of about 0.25 to about 5 percent by weight.

The abrasive can have any suitable particle size. Preferably, the mean particle size of the abrasive is in the range of about 20 nm to about 300 nm. The mean particle size is reported as determined by light scattering, for example, using a Horiba LA-910 instrument.

In addition, the composition may include one or more auxiliary abrasive, if desired. Auxiliary abrasives include, without limitation, diamond (e.g., polycrystalline diamond), garnet, glass, carborundum, metal oxide (silica, doped silica, ceria, or any combination thereof), nitride, carbide, polymer, composite (e.g., polymer composite or polymer/metal oxide composite), and the like or combinations thereof. Any suitable amount of auxiliary abrasive can be present in the polishing composition.

The compositions of the present invention also include about 0.1 to about 10 percent by weight of an alkali metal iodate salt as an oxidizer. A preferred alkali metal iodate salt is potassium iodate. Preferably the alkali metal iodate salt is present in the composition in an amount in the range of about 0.25 to about 2 percent by weight.

Any liquid carrier suitable for use in CMP processing can be utilized in the tantalum CMP compositions of the present invention. The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

In some embodiments, the tantalum CMP compositions of the invention further comprise an excipient such as an alkali metal salt, a surfactant, a chelating agent, a passivating agent, an oxidation inhibitor, and the like. For example, the CMP compositions of the invention can include a copper oxidation inhibiting agent, if desired. Non-limiting examples of copper oxidation inhibiting agents include triazole and its derivatives, such as 1,2,4 triazole, 1H-1,2,3 triazole, s-triazine, 1H-1,2,4-triazole-3-thiol, 1,2,4-triazolo[1,5-a]pyrimidine, 1H-1,2,3-triazolo[4,5-b]pyridine, 1,2,3-triazole-4,5-dicarboxylic acid; benzotriazole and its derivatives, such as 1H-benzotriazole, 1H-benzotriazole-1-carboxaldehyde, benzotriazole-5-carboxylic acid, 5-methyl-1H-benzotriazole, 5-chlorobenzotriazole, 1-(isocyanomethyl)-1H-benzoriazole; and the like.

A method for polishing a tantalum-containing surface of a substrate comprises abrading a surface of a substrate with a tantalum CMP composition of the invention. Preferably, the substrate to be polished (e.g., a semiconductor wafer) is mounted on the platen of a CMP apparatus and the CMP composition is supplied to the surface of the substrate to be polished. A polishing pad is then utilized to abrade the surface of the wafer, aided by the CMP composition. At least a portion of the CMP composition is maintained between the pad and the surface of the substrate being polished. The pad can be any conventional polishing pad, including, without limitation, a foamed or solid polymer pad (e.g., a polyurethane pad), a pad including imbedded abrasive particles (i.e., a fixed abrasive pad), and the like, as described herein and as is well known in the CMP art.

The substrate can be any suitable tantalum-containing substrate (e.g., integrated circuit, memory or rigid disk, metal, ILD layer, semiconductor, micro-electro-mechanical system, ferroelectric, magnetic head, polymeric film, and low or high dielectric constant film). The insulating layer can comprise any suitable insulating material, such as a metal oxide, porous metal oxide, glass, organic polymer, fluorinated organic polymer, or any other suitable high or low-κ insulating material. The insulating layer preferably comprises a silicon-based metal oxide. Preferably, the surface to be polished comprises, at least in part, tantalum, tantalum nitride, or a combination thereof. The substrate can also preferably includes materials copper and/or various forms of silicon oxide, such as TEOS.

The following examples further illustrate the invention but, of course, should not be construed as in any way limiting its scope.

In the examples, tantalum blanket wafers (4 inches in diameter having a metallic tantalum surface layer of about 3000 Å thickness on a silicon substrate) were polished on a CETR table-top polisher using a down-force of about 1.5 pounds per square inch (psi), a platen speed of about 133 revolutions per minute (rpm), a carrier speed of about 120 rpm, and a slurry feed rate of about 60 milliliters per minute (ml/min), using a conventional polymeric A100 polishing pad, and the CMP compositions of Examples 1-7 as the polishing slurries. The wafers were polished for about 60 second intervals. Wafer thickness was determined before and after each polishing using a KLA Tencor SURFSCAN® RS-75 device. The tantalum removal rate (in Angstroms per minute, Å/min) was calculated according to the following equation: Removal rate=[(pre-polishing thickness−post-polishing thickness)/1 minute]. Two wafers were polished per slurry and the removal rates were averaged.

A commercial slurry (EP-6618, Cabot Microelectronics Corporation, Aurora Ill.) was utilized for comparison purposes and for pad conditioning. The commercial slurry had a tantalum removal rate (Ta RR) of about 530 Å/min for a 8 inch diameter tantalum blanket wafer polished with an A 110 pad on a Mirra polisher.

Example 1

This example demonstrates the effect of pH on tantalum removal rate for a CMP composition (slurry) of the invention.

A CMP composition was prepared containing about 3 percent by weight fumed alumina and about 1.07 percent by weight of potassium iodate in deionized water. The composition was divided into 10 batches, and the pH of each batch was adjusted to a pH in the range of about 2 to about 14 (i.e., pH 2, 4, 6, 8, 9, 10, 11, 12, 13, and 14). Tantalum blanket wafers (4 inch diameter) were polished with each composition, as described above. The results (Ta RR in Å/min) are shown graphically in FIG. 1. The data in FIG. 1 indicate that the tantalum removal rate increased 4-fold at a pH of 12 or greater relative to pH 11 and below for the fumed alumina compositions containing about 1 percent potassium iodate.

Example 2

This example demonstrates the effect of abrasive and oxidizer concentration on tantalum removal rate for CMP compositions of the invention.

Figure 2:
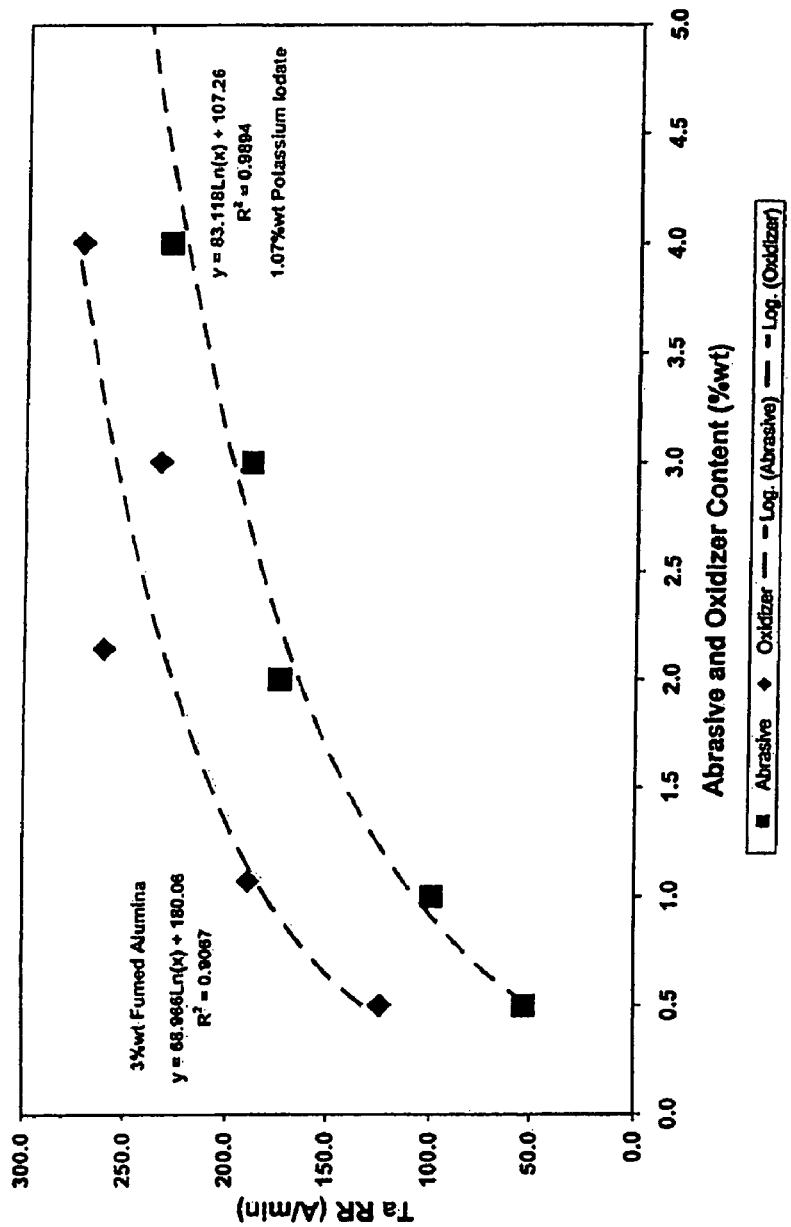
FIG. 2 illustrates the effect of abrasive concentration and iodate concentration on tantalum removal rates for CMP compositions containing fumed alumina and potassium iodate.

Five CMP compositions were prepared containing about 0.5 to about 4 percent by weight of fumed alumina and about 1 percent by weight of potassium iodate in deionized water. Five additional CMP compositions were prepared containing about 0.5 to about 4 percent by weight of potassium iodate and about 3 percent by weight of fumed alumina. The pH of each of the compositions was about 10. Tantalum blanket wafers (4 inch diameter) were polished with each composition, as described above. The results (Ta RR in Å/min) are shown graphically in FIG. 2. The data in FIG. 2 indicate that the tantalum removal rate increased with increasing iodate concentration and with increasing alumina concentration.

Example 3

This example illustrates tantalum removal selectivity relative to copper and silicon oxide removal for CMP compositions of the invention.

Four CMP compositions were prepared (Compositions 3A, 3B, 3C, and 3D). Each of the compositions contained about 3 percent by weight of fumed alumina and about 1.07 percent by weight of potassium iodate. Composition 3A had a pH of about 12. Composition 3B had a pH of about 13. Composition 3C had a pH of about 12 and also included about 0.35 percent by weight of tartaric acid. Composition 3D had a pH of about 12 and also included about 1 percent by weight of tartaric acid. Tantalum blanket wafers (4 inch diameter) were polished with each composition, as described above. In addition TEOS and copper blanket wafers were polished under the same conditions as the tantalum wafers, so that removal rates for tantalum, copper and TEOS could be compared. The results (Ta RR, Cu RR, TEOS RR, each in Å/min, and the ratio of TEOS:Cu:Ta removal rates) are shown in Table 1. The data in Table 1 indicate that the CMP compositions of the present invention are selective for tantalum removal relative to copper and silicon oxide (TEOS). Copper removal rates were slightly increased by the addition of tartaric acid (a chelating agent) without significantly affecting the Ta removal rates. Advantageously, the Ta/Cu selectivity can be varied by varying the pH of the composition (see results for 3A compared to 3B).

TABLE 1

| Slurry | Ta RR | Cu RR | TEOS RR | TEOS:Cu:Ta RR |
|---|---|---|---|---|
| 3A | 406 | 108 | 53 | 0.13:0.27:1 |
| 3B | 480 | 447 | 44 | 0.09:0.93:1 |
| 3C | 409 | 130 | 36 | 0.09:0.32:1 |
| 3D | 436 | 155 | 15 | 0.03:0.36:1 |

Example 4

This example compares tantalum removal rates for CMP compositions of the invention, containing potassium iodate as an oxidizing agent, to compositions containing hydrogen peroxide or no oxidizer in place of the iodate.

Nine CMP compositions were prepared containing about 3 percent by weight of fumed alumina. Compositions 4A, 4B, and 4C included about 1.07 percent by weight of potassium iodate (50 mM) and had pH values of 11, 12, and 13, respectively. Compositions 4D, 4E, and 4F included about 3 percent by weight (882 mM) of hydrogen peroxide and had pH values of 11, 12, and 13, respectively. Compositions 4G, 4H, and 4I included did not include any oxidizer and had pH values of 11, 12, and 13, respectively. Tantalum blanket wafers (4 inch diameter) were polished with each composition, as described above. The results (Ta RR) are shown graphically in Table 2. The data in Table 2 indicate that at pH 12 and 13, the tantalum removal rate for CMP compositions of the invention (4B and 4C, containing 50 mM potassium iodate) surprisingly exhibited a superior Ta removal rate compared to 3 percent hydrogen peroxide (885 mM). Even at pH 11, Composition 4A had only a marginally lower Ta removal rate than Composition 4D, even though the hydrogen peroxide formulations included over 17 times more oxidant, on a molar basis, than the potassium iodate compositions.

TABLE 2

| Slurry | pH | Oxidizer | Ta RR (Å/min) |
|---|---|---|---|
| 4A | 11 | $KIO_3$ | 163 |
| 4B | 12 | $KIO_3$ | 471 |
| 4C | 13 | $KIO_3$ | 522 |
| 4D | 11 | $H_2O_2$ | 205 |
| 4E | 12 | $H_2O_2$ | 138 |
| 4F | 13 | $H_2O_2$ | 301 |
| 4G | 11 | none | 14 |
| 4H | 12 | none | 59 |
| 4I | 13 | none | 49 |

Example 5

This example illustrates the effects of pH on tantalum removal rates for CMP compositions of the invention that contain zirconium oxide (zirconia) as an abrasive.

Figure 3:
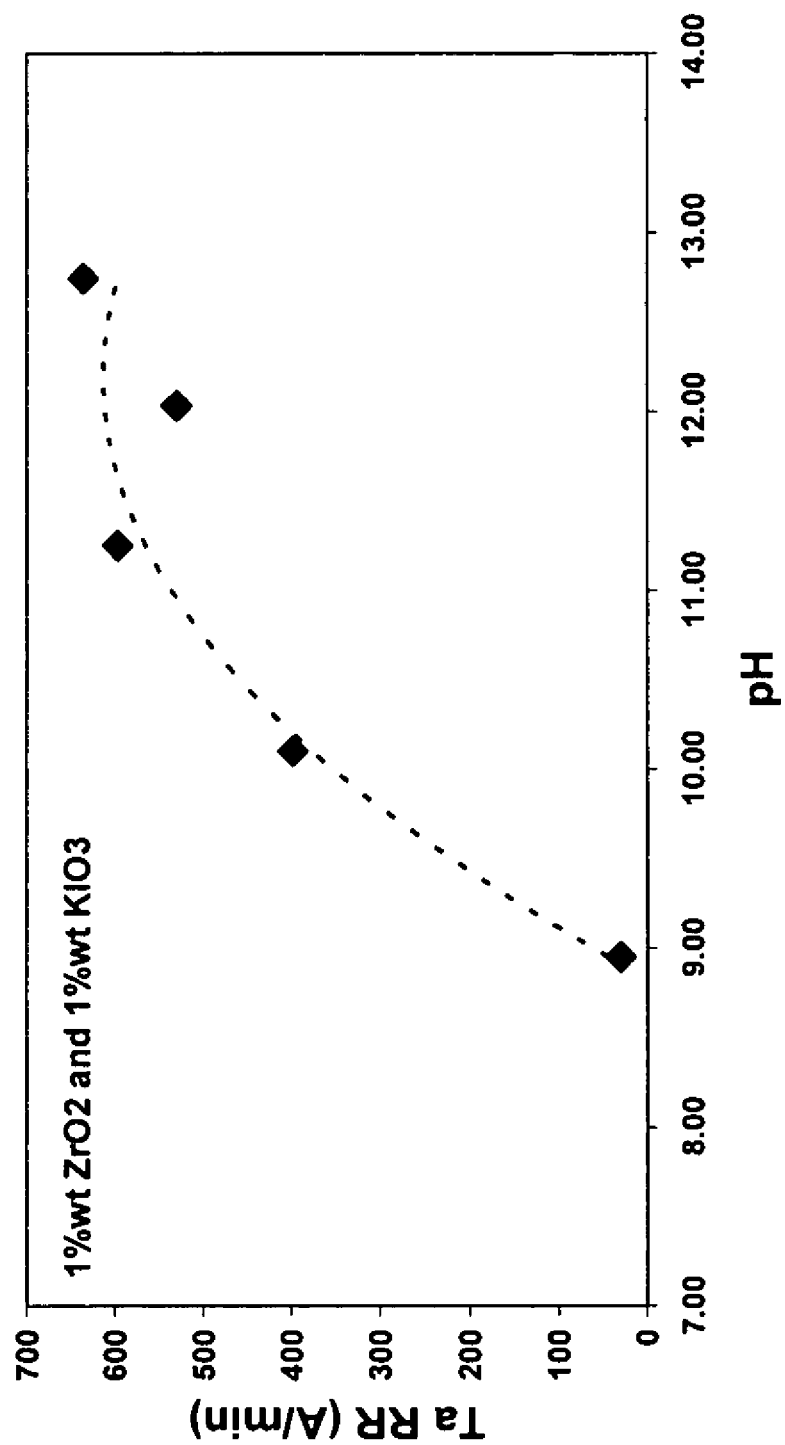
FIG. 3 illustrates the effect of pH on tantalum removal rates for CMP compositions containing zirconia and potassium iodate.

A CMP composition was prepared containing about 1 percent by weight of $ZrO2$ and about 1 percent by weight potassium iodate. The composition was divided into five batches having pH values varying from pH 9 to about pH 13 (about pH 9, 10, 11, 12, and 13). Each composition was used to polish tantalum blanket wafers, as described above. The results are shown graphically in FIG. 3. The data in FIG. 3 show that CMP compositions of the invention containing zirconia and an iodate salt exhibited relatively high tantalum removal rates (400 to 600 Å/min) at pH 10-13.

Example 6

This example illustrates the effects of zirconia concentration on tantalum removal rates for CMP compositions of the invention.

Figure 4:
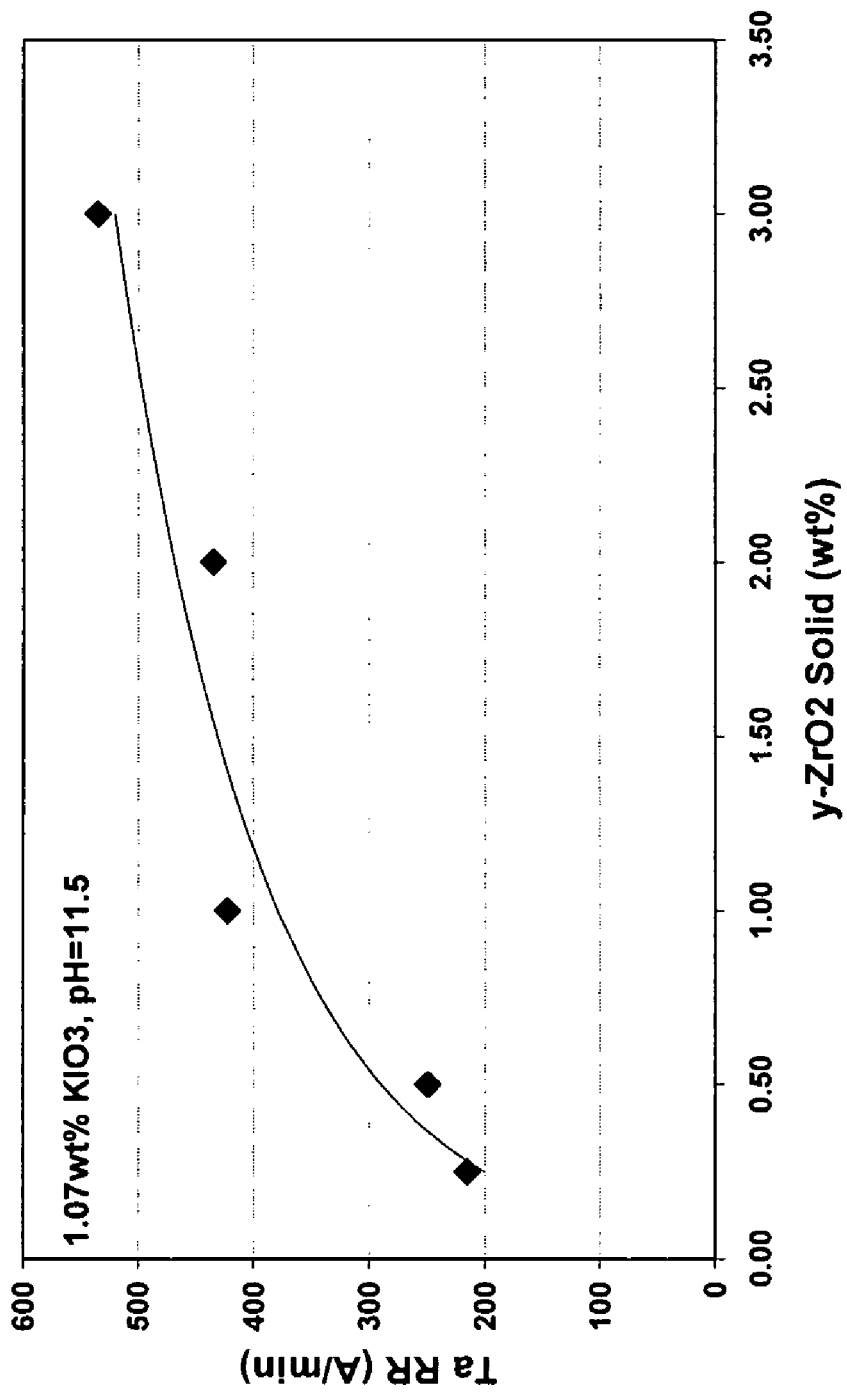
FIG. 4 illustrates the effect of abrasive concentration on tantalum removal rates for CMP compositions containing zirconia and potassium iodate.

Five CMP compositions having a pH of about 11.5 and containing about 1 percent by weight of potassium iodate and varying amounts of yttrium-stabilized zirconia (about 0.25 to about 3 percent by weight) were prepared. Each composition was used to polish tantalum blanket wafers, as described above. The results are shown graphically in FIG. 4. The data in FIG. 4 show that the tantalum removal rates increase with increasing zirconia concentration.

Example 7

This example illustrates the effects of iodate concentration on tantalum removal rates for CMP compositions of the invention containing a zirconia abrasive.

Figure 5:
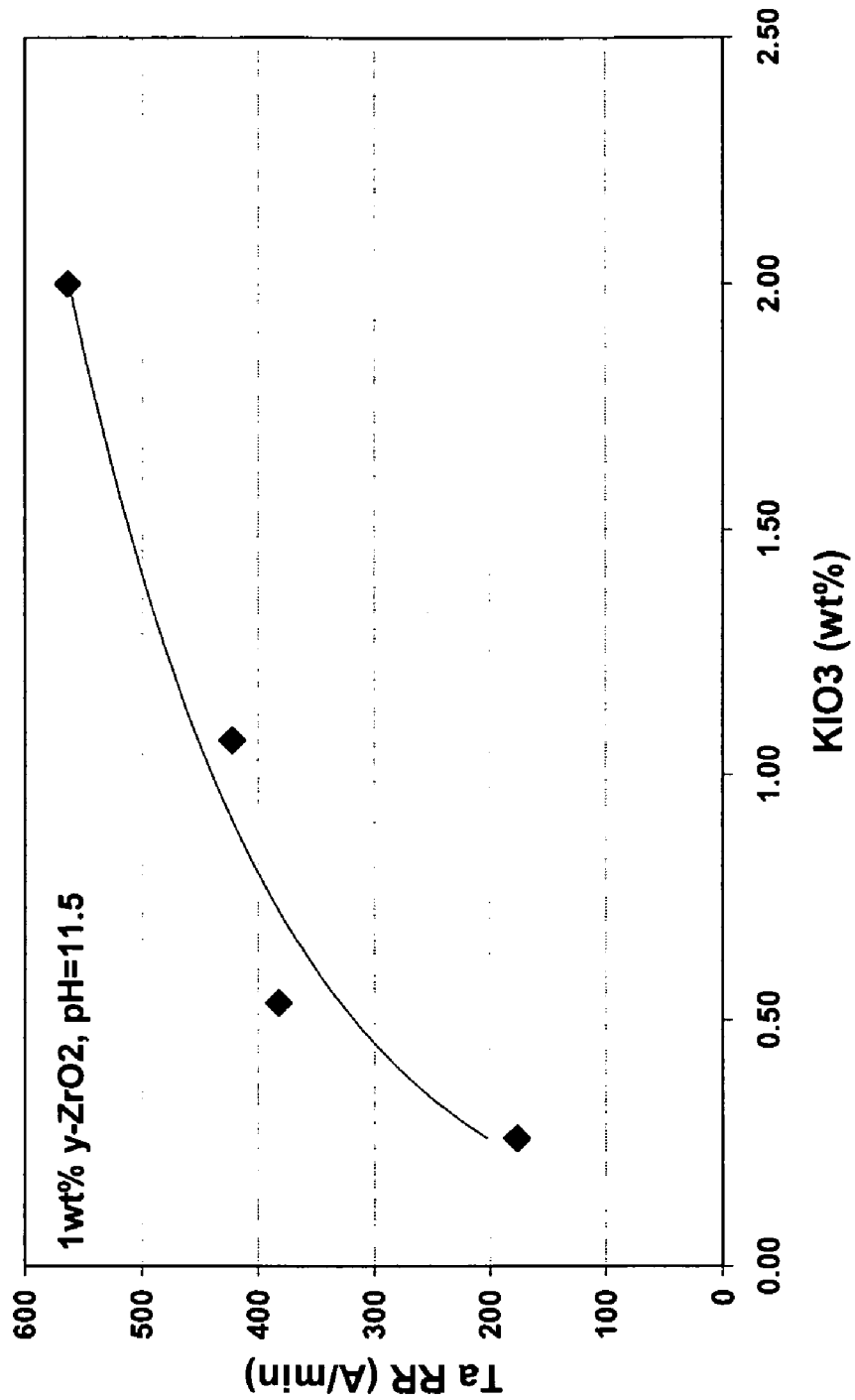
FIG. 5 illustrates the effect of iodate concentration on tantalum removal rates for CMP compositions containing zirconia and potassium iodate.

Four CMP compositions having a pH of about 11.5 and containing about 1 percent by weight of yttrium-stabilized zirconia and varying amounts of potassium iodate (about 0.25 to about 2 percent by weight) were prepared. Each composition was used to polish tantalum blanket wafers, as described above. The results are shown graphically in FIG. 5. The data in FIG. 5 show that the tantalum removal rates increase with increasing iodate concentration.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing composition for polishing a tantalum containing substrate consisting essentially of:
   (a) about 0.1 to about 10 percent by weight of a zirconia or fumed alumina abrasive;
   (b) about 0.1 to about 10 percent by weight of an alkali metal iodate salt; and
   (c) an aqueous liquid carrier therefor
the composition having a pH of at least about 10.

2. The composition of claim 1 wherein the alkali metal iodate salt is potassium iodate.

3. The composition of claim 1 wherein the abrasive is present in the composition in an amount in the range of about 0.25 to about 5 percent by weight.

4. The composition of claim 1 wherein the alkali metal iodate salt is present in the composition at a concentration in an amount in the range of about 0.25 to about 5 percent by weight.

5. The composition of claim 1 wherein the composition has a pH of at least about 12.

6. A chemical-mechanical polishing composition for polishing a tantalum containing substrate consisting essentially of:
   (a) about 0.25 to about 5 percent by weight of a zirconia abrasive;
   (b) about 0.25 to about 5 percent by weight of an alkali metal iodate salt; and
   (c) an aqueous liquid carrier therefor;
the composition having a pH of at least about 10.

7. The composition of claim 6 wherein the alkali metal iodate salt comprises potassium iodate.

8. A chemical-mechanical polishing composition for polishing a tantalum containing substrate consisting essentially of:
   (a) about 0.25 to about 5 percent by weight of a fumed alumina abrasive;
   (b) about 0.25 to about 5 percent by weight of an alkali metal iodate salt; and
   (c) an aqueous liquid carrier therefor;
the composition having a pH of at least about 12.

9. The composition of claim 8 wherein the alkali metal iodate salt comprises potassium iodate.

10. A method for chemical-mechanical polishing a tantalum-containing substrate comprising:
   abrading a surface of a tantalum-containing substrate with a polishing composition of claim 1.

11. The method of claim 10 wherein the alkali metal iodate salt is potassium iodate.

12. The method of claim 10 wherein the abrasive is present in the composition in an amount in the range of about 0.25 to about 5 percent by weight.

13. The method of claim 10 wherein the alkali metal iodate salt is present in the composition in an amount in the range of about 0.25 to about 5 percent by weight.

14. The method of claim 10 wherein the alkali metal iodate salt comprises potassium iodate.

15. The method of claim 10 wherein the composition has a pH of at least about 12.

16. The method of claim 10 wherein the abrasive is zirconia.

17. The method of claim 10 wherein the abrasive is fumed alumina.

18. The method of claim 10 wherein the substrate further comprises copper.

19. The method of claim 18 wherein the substrate further comprises a silicon oxide material.

20. The method of claim 10 wherein the substrate further comprises a silicon oxide material.

* * * * *